US006909052B1

(12) United States Patent
Haug et al.

(10) Patent No.: US 6,909,052 B1
(45) Date of Patent: Jun. 21, 2005

(54) TECHNIQUES FOR MAKING A CIRCUIT BOARD WITH IMPROVED IMPEDANCE CHARACTERISTICS

(75) Inventors: Darrin J. Haug, Bellingham, MA (US); Brandon Barney, Hudson, MA (US)

(73) Assignee: EMC Corporation, Hopkinton, MA (US)

( * ) Notice: Subject to any disclaimer, the term of this patent is extended or adjusted under 35 U.S.C. 154(b) by 220 days.

(21) Appl. No.: 10/226,845

(22) Filed: Aug. 23, 2002

(51) Int. Cl.[7] .............................................. H05K 7/06
(52) U.S. Cl. ...................................... 174/255; 174/262
(58) Field of Search ................................ 174/255, 262; 361/780, 794; 257/691

(56) References Cited

U.S. PATENT DOCUMENTS

| | | | |
|---|---|---|---|
| 5,966,294 A | 10/1999 | Harada et al. ............... | 361/794 |
| 6,198,362 B1 * | 3/2001 | Harada et al. ................ | 333/12 |
| 6,300,847 B1 | 10/2001 | Gallagher et al. ............ | 333/33 |
| 6,388,890 B1 * | 5/2002 | Kwong et al. ............... | 361/780 |
| 6,600,790 B1 | 7/2003 | Umemura et al. ........... | 375/257 |
| 2004/0040744 A1 * | 3/2004 | Wyrzykowska et al. .... | 174/262 |

* cited by examiner

Primary Examiner—John B. Vigushin
(74) Attorney, Agent, or Firm—Chapin & Huang, L.L.C.; David E. Huang, Esq.

(57) ABSTRACT

A circuit board has a first signal layer having a set of conductors, a second signal layer having a conductive plane and a non-conductive region, and a third signal layer having a conductive region that mirrors the non-conductive region of the second signal layer. The circuit board further includes a first separating layer having non-conductive material which is disposed between the first signal layer and the second signal layer, and a second separating layer having non-conductive material which is disposed between the second signal layer and the third signal layer. Accordingly, traces within the first signal layer and overlying the conductive plane of the second signal layer will have a first impedance, while traces within the first signal layer and overlying the non-conductive region of the second signal layer and the conductive region of the third signal layer will have a second impedance that is different than the first impedance.

23 Claims, 7 Drawing Sheets

TECHNIQUES FOR MAKING A CIRCUIT BOARD WITH IMPROVED IMPEDANCE CHARACTERISTICS

BACKGROUND OF THE INVENTION

A typical circuit board includes layers of conductive material (e.g., copper) and non-conductive material (e.g., fiberglass) sandwiched together to form a single, rigid board. Some circuit boards include many layers (e.g., more than 20 layers of material).

In general, to manufacture a circuit board having many layers, a circuit board manufacturer creates separate circuit board sheets. Each circuit board sheet typically includes two conductive signal layers and a non-conductive separating layer disposed between the conductive signal layers. The manufacturer typically aligns the circuit board sheets on top of each other and along with other non-conductive sheets (e.g., non-conductive core layers) in an interleaved manner, and laminates the sheets together to form an integrated board, e.g., applies glue, pressure and heat to combine the sheets into the board. Then, among other things, the manufacturer cuts and drills particular features into the board (e.g., mounting holes, notches, etc.), cleans the board, and deposits other features on the exposed surfaces of the board (e.g., plated through-holes, pads, protective coatings, etc.). The manufacturer also mounts circuit board components to the board (e.g., integrated circuits, resistors, capacitors, connectors, etc.) thus forming a completed circuit board.

A typical circuit board includes, as some of the signal layers, ground and power planes for providing power to the circuitry of the circuit board. A ground plane is a signal layer which is generally contiguous in all directions throughout that signal layer, and which is configured to carry a power supply ground signal from an external power supply to the circuit board circuitry (e.g., a reference voltage such as zero volts, chassis ground, etc.). Similarly, a power plane is a signal layer which is generally contiguous in all directions throughout that signal layer, and which is configured to carry a power supply voltage signal from the power supply to the circuit board circuitry (e.g., a DC voltage at a predetermined potential difference from the ground signal).

The typical circuit board further includes other signal layers which do not carry power supply signals for powering the circuit board circuitry, i.e., signal layers which are configured to exclusively carry data signals containing information for controlling the operation of the circuit board circuitry. Such a signal layer typically includes conductive traces. Some of these traces can run individually (i.e., alone), and others can run in sets (e.g., as buses, as differential signal pairs, etc.). For such data signal traces, manufacturers typically attempt to provide line impedances matching the circuit board circuitry so that signal reflection back to the circuitry generating the data signals, and to the receiving circuitry, is minimal.

For example, a signal layer can include differential pair traces which are purposefully spaced a fixed distance apart from each other and from a neighboring ground or power plane so that the impedance between the lines is a fixed and fairly uniform value matching that of the circuitry to which the lines are connected in order to minimize signal reflection. Such traces are further purposefully positioned close to each other so that they share the same exposure to noise (e.g., so that high-frequency differential signals on the lines are exposed to the same interference from components, neighboring traces, etc.).

In some situations, the circuit board includes differential pair traces having a differential impedance of a first value (e.g., 100 Ohms) to accommodate a first type of circuitry (e.g., a processor chipset), and other differential pair traces having another differential impedance of a different value (e.g., 150 Ohms) to accommodate a second type of circuitry (e.g., Fibre Channel devices). One conventional approach to designing a circuit board that includes a signal layer having differential pair traces of different differential impedances is for the manufacturer to initially set (i) the trace widths of all traces to the same trace width value, (ii) the distance between the traces of each differential trace pair to the same trace separation value, and (iii) the distance between the differential trace pairs and the closest ground or power plane to the same layer separation value. At this point, all of the differential pair traces of the design provide a first differential impedance for a first type of circuitry. Next, the manufacturer changes the differential impedance in the design for certain differential pair traces to provide a different differential impedance for a second type of circuitry. To this end, the manufacturer modifies the trace width value and/or the trace separation value for these particular differential pair traces.

For example, a manufacturer can start with a circuit board design exclusively having 50 Ohm traces with some 100 Ohm differential pair traces, and can subsequently convert a few of the 100 Ohm differential pair traces into 150 Ohm differential pair traces. In this example, suppose that the 50 Ohm traces are required to accommodate the majority of circuitry board circuitry (e.g., a processor chipset), and the few 150 Ohm differential pair traces are required to accommodate some other circuitry (e.g., Fibre Channel I/O devices). The manufacturer initially sets the trace width, trace separation, and layer separation values within the design to values that provide 50 Ohm impedance traces and 100 Ohm differential impedance between differential pair traces. Then, the manufacturer converts some of the 100 Ohm differential pair traces within the design into 150 Ohm differential pair traces by decreasing the trace widths and/or increasing the trace distance between differential pair traces to increase the standard impedance of those traces to 75 Ohms or greater (i.e., the impedance between the traces and the closest ground or power plane), and to increase the differential impedance of those differential pair traces to 150 Ohms. The end result is a circuit board having a signal layer that includes both differential pair traces having 100 Ohm impedance (e.g., for the processor chipset circuitry) as well as other differential pair traces having 150 Ohm impedance (e.g., for the Fibre Channel I/O circuitry).

SUMMARY OF THE INVENTION

Unfortunately, there are deficiencies to the above-described conventional approach to designing a circuit board having a signal layer which includes differential pair traces of different impedance values. In particular, limitations may exist that prevent the circuit board manufacturer from modifying particular aspects of the signal layer traces.

For example, suppose that a manufacturer designs a circuit board having a signal layer which includes differential pair traces of 100 Ohms in order to accommodate a first type of circuitry (e.g., a processor chipset). Further suppose that the manufacturer wishes to include other differential pair traces of 150 Ohms in that signal layer in order to accommodate a second type of circuitry (e.g., Fibre Channel devices). To accomplish incorporation of differential pair traces of 150 Ohms in that signal layer, the manufacturer could consider laying out differential pair traces which are similar to those of 100 Ohms, but which are slightly narrower and/or which are slightly further apart than the differential pair traces of 100 Ohms in order to form differential pair traces of 150 Ohms.

However, the manufacturer may not be able to make the differential pair traces of 150 Ohms slightly narrower if the manufacturer has already set the 100 Ohm differential pair traces to the minimum trace width acceptable for the circuit board. Making a trace narrower than the minimum trace width acceptable for the circuit board would result in the manufacturer violating the circuit board specifications and perhaps lead to undesirable side effects (e.g., improper signal strength, timing anomalies, open circuits, capacitance problems, etc.). Furthermore, the manufacturer may not wish to increase the trace separation distance between the differential pair traces since such an increase in separation could result in exposing the data signals within the differential pair traces to different interference patterns thus defeating the purpose of providing the differential pair traces for differential signals, i.e., the data signals within the differential pair traces may no longer share the same noise.

In contrast to the above-described conventional approach to designing a circuit board having a signal layer which includes differential pair traces of different impedances by simply modifying trace width and trace separation distances, the invention is directed to techniques for making a circuit board which involve, relative to a set of signal layer traces, placing a non-conductive region within a conductive plane of another signal layer, and a mirroring conductive region in yet another signal layer. Thus, any signal layer trace overlying the non-conductive region within the conductive plane can derive its impedance based on its distance from the mirroring conductive region rather than its distance from the conductive plane. Accordingly, some signal layer traces can have a first impedance (e.g., 50 Ohms) based on distance from the conductive plane while other signal layer traces can have a second impedance (e.g., 90 Ohms), which is different than the first impedance, based on distance from the mirroring conductive region.

One embodiment of the invention is directed to a circuit board having a first signal layer having a set of conductors, a second signal layer having a conductive plane and a non-conductive region (e.g., a carved-out portion of the conductive plane), and a third signal layer having a conductive region that mirrors the non-conductive region of the second signal layer. The circuit board further includes a first separating layer having non-conductive material which is disposed between the first signal layer and the second signal layer, and a second separating layer having non-conductive material which is disposed between the second signal layer and the third signal layer. Accordingly, traces within the first signal layer and overlying the conductive plane of the second signal layer will have a first impedance, while traces within the first signal layer and overlying the non-conductive region of the second signal layer and further overlying the conductive region of the third signal layer will have a second impedance that is different than the first impedance.

The features of the invention, as described above, may be employed in electronic systems, devices and methods as well as other computer-related components such as those of EMC Corporation of Hopkinton, Mass.

BRIEF DESCRIPTION OF THE DRAWINGS

The foregoing and other objects, features and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

The invention is directed to techniques for making a circuit board which involve, relative to a set of signal layer traces, placing a non-conductive region within a conductive plane of another signal layer, and a mirroring conductive region in yet another signal layer. Accordingly, any signal layer trace passing over the non-conductive region within the conductive plane can derive its impedance based on its distance from the mirroring conductive region rather than its distance from the conductive plane. As a result, some signal layer traces can have a first impedance based on distance from the conductive plane while other signal layer traces can have a second impedance, which is different than the first impedance, based on distance from the conductive region.

Figure 1:
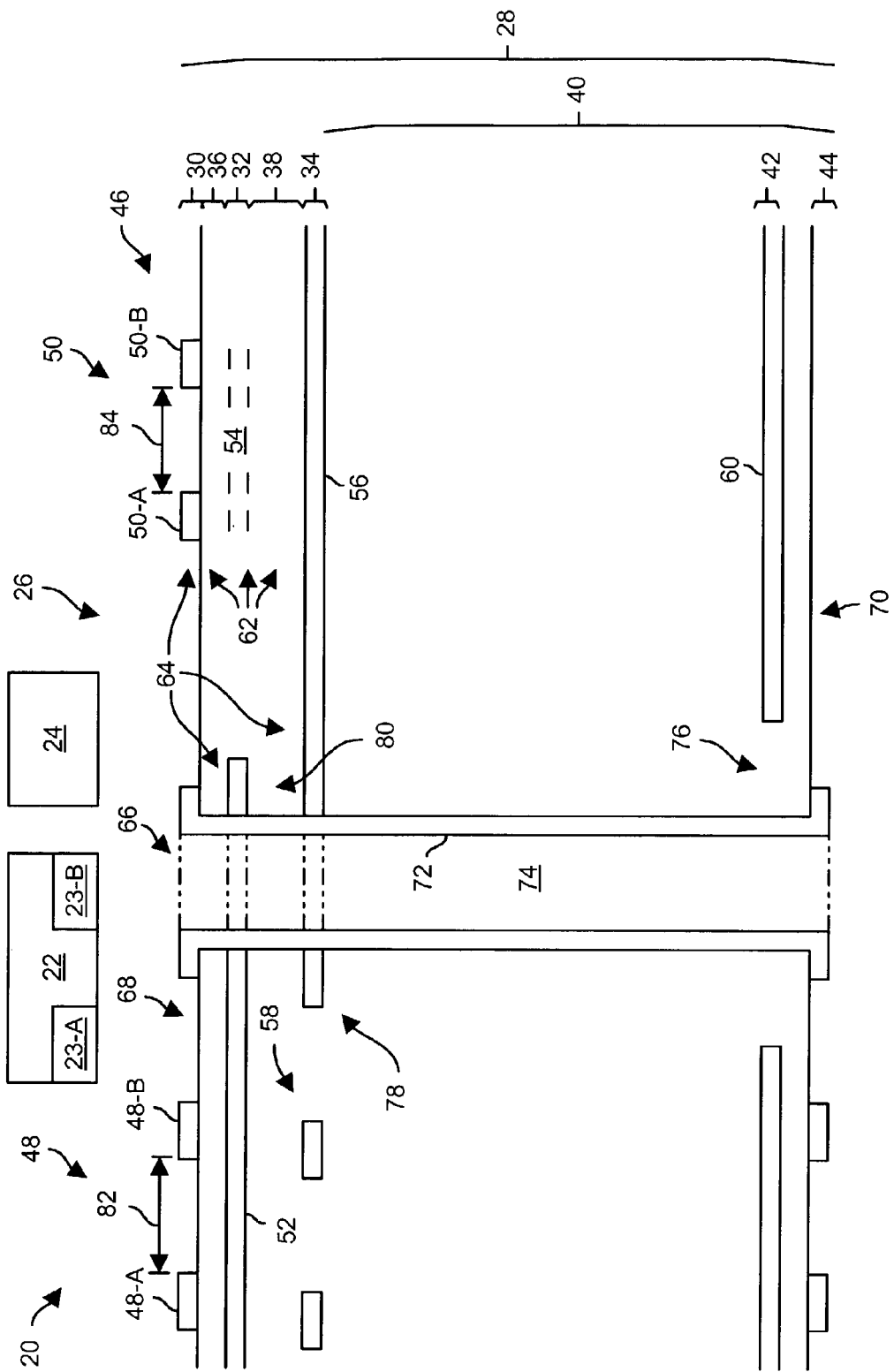
FIG. 1 is a view of an electronic system having a circuit board which is suitable for use by the invention.

FIG. 1 shows an electronic system 20 which is suitable for use by the invention. The electronic system 20 includes a power supply 22 having a voltage terminal 23-A and a ground terminal 23-B. The electronic system 20 further includes an interconnect 24 and a circuit board 26. The interconnect 24 (e.g., a connector assembly, a backplane, etc.) places the circuit board 26 in electrical communication with the power supply 22 to enable the power supply 22 to provide power to electronic circuitry of the circuit board 26. The interconnect 24 can also interconnect the circuit board 26 with other devices as well, e.g., other circuit boards, a backup power supply, etc. The power supply 22 and the interconnect 24 are in block diagram form in FIG. 1 for simplicity. In contrast, a cross-sectional view of the circuit board 26 is shown in FIG. 1 in order to illustrate particular layer features of the circuit board 26.

As shown in FIG. 1, the circuit board 26 includes multiple circuit board layers 28 which are sandwiched together into an integrated, rigid board. The layers 28 include a signal layer 30, another signal layer 32 and yet another signal layer 34. The layers 28 further include a separating layer 36 disposed between the signal layer 30 and the signal layer 32, and another separating layer 38 disposed between the signal layer 32 and the signal layer 34. By way of example only, the signal layer 30 is a top surface layer, and the signal layers 32, 34 are inner layers. Further, by way of example only, the layers 28 include other layers 40 (e.g., 20 or more layers) such as another imbedded signal layer 42 and another surface signal layer 44.

As shown in FIG. 1, the signal layer 30 includes a set of conductors 46 (e.g., outer-layer surface traces). The set of conductors 46 includes, by way of example, a first set of differential pair traces 48-A, 48-B (collectively, traces 48), and a second set of differential pair traces 50-A, 50-B (collectively, traces 50). As will be explained in further detail shortly, the differential pair traces 48, 50 have different impedances thus making the circuit board well-suited for accommodating circuitry that requires the different impedances in order to minimize signal reflection and provide robust signal integrity.

As further shown in FIG. 1, the signal layer 32 includes a conductive plane 52 and a non-conductive region 54 (the dashed lines around reference numeral 54 illustrate the boundaries between the non-conductive region 54 of the signal layer 32 and the separating layers 36, 38). The signal layer 34 includes a conductive region 56 and a set of conductors 58 (i.e., inner-layer traces). The conductive region 56 is a contiguous planar-shaped section having a planer width that is substantially wider than that of a trace (wider than each of the inner-layer signal line etches 58). The signal layer 42 includes another conductive plane 60 by way of example only. The separating layer 36 includes non-conductive material 62 (e.g., FR4) which separates conductive material 64 (e.g., copper) of the signal layers 30, 32. Similarly, the separating layer 38 includes non-conductive material 62 which separates the conductive material 64 of the signal layers 32, 34.

The circuit board 26 further includes a set of plated through-holes (PTHs) 66 that extend from a top surface 68 of the circuit board 26 to a bottom surface 70 of the circuit board 26 through the circuit board layers 28. The plated through-holes 66 electrically connect the conductive plane 52 of the signal layer 32 with the conductive region 56 of the signal layer 34. By way of example (and shown by the dashed lines of the plated through-hole 66 of FIG. 1 illustrating the circular shape of the plated through-holes 66), each plated through-hole 66 is essentially a metallic shell 72 (e.g., nickel cylinder) having a hollow central area 74. This shell 72 physically connects with the conductive material 64 of signal layers (e.g., the conductive plane 52 of the signal layer 32 and the conductive region 56 of the signal layer 34) to form an electrical connection. Conductive planes (e.g., the conductive plane 60 of the signal layer 42) which do not electrically connect with the plated through-holes 66 define anti-pads 76 (i.e., non-conductive areas) that surround the plated through-holes 66 thus avoiding direct contact with the metallic shells 72 of the plated through-holes 66. The circuit board 26 can include other plated through-holes for connecting other conductors together.

As illustrated by the cross-sectional view of the circuit board 26 in FIG. 1, the conductive plane 52 of the signal layer 32 is not substantially contiguous throughout the signal layer 32. Rather, the conductive plane 52 terminates at the non-conductive region 54. That is, the non-conductive region 54 is essentially a carve-out of the conductive plane 52. Furthermore, the conductive region 56 of the signal layer 34 mirrors the non-conductive region 54 of the signal layer 32. That is, the conductive region 56 covers the carved-out area of the conductive plane 52. In particular, outer edges 78 of the conductive region 56 extend slightly beyond inner edges 80 of the conductive plane 52 in an overlapping manner to enable the plated through-holes 66 to electrically connect the conductive plane 52 with the conductive region 56. In one arrangement, the circuit board 26 includes plated through-holes 66 which are distributed around the periphery of the conductive region 56 (i.e., around the edges 78, 80) to place the conductive region 56 in robust electrical communication with the conductive plane 52. Accordingly, the conductive region 56 of the signal layer 34 is essentially an extension of the conductive plane 52 of the signal layer 32 but at a different level within the circuit board 26.

It should be understood that the conductive region 56 of the signal layer 34 mirrors the non-conductive region 54 by roughly reflecting the shape of the non-conductive region 54 and by covering the carved-out area of the conductive plane 52. It is not imperative that the conductive region 56 of the signal layer 34 precisely or exactly match the shape of the non-conductive region 54 of the signal layer 32. Rather, the conductive region 56 can simply mimic the non-conductive region 54 with enough overlap to enable the plated through-holes 66 to properly electrically connect the conductive plane 52 to the conductive region 56. If the amount of overlap is kept to a minimum, there is more area (i.e., circuit board "real estate") within the signal layer 34 to place other traces (e.g., see the traces 58 in FIG. 1). The operation of particular parts of the circuit board 26 will now be explained in further detail.

The conductive plane 52 of the signal layer 32 and the conductive region 54 of the signal layer 34 are configured to operate as a power supply plane by receiving a power supply signal (e.g., a DC voltage signal, a ground signal, etc.) from the external power supply 22 through the interconnect 24 (see the power supply terminals 23-A, 23-B of the power supply 22). By way of example only, the conductive plane 60 of the signal layer 42 is configured to operate as another power supply plane by receiving another power supply signal from the power supply 22 (e.g., is configured to provide a return path for the power supply signal carried by the conductive plane 52 and the conductive region 54 back to the power supply 22). Accordingly, circuitry of the circuit board 26 can receive power from the power supply 22.

The conductive planes 52, 60 and the conductive region 54 influence the line impedances of neighboring traces. In particular and as illustrated in FIG. 1, the differential pair traces 48 are positioned on the surface 68 of the circuit board 26 such that they are closest to the conductive plane 52 of the signal layer 32, i.e., the differential pair traces 48 overly the conductive plane 52. Accordingly, the differential pair traces 48 derive impedance from the conductive plane 52. Similarly, the differential pair traces 50 are positioned such that they are closest to the conductive region 54 rather than the conductive plane 52, i.e., the differential pair traces 50 are disposed over the conductive plane 54 of the signal layer 34. Accordingly, the differential pair traces 50 derive impedance from the conductive region 54 rather than the conductive plane 52 of the signal layer 32. As a result, the traces 48 can have a different standard impedance than that of the traces 50. Additionally, the differential pair traces 48 can have a different differential impedance than that of the traces 50.

In one arrangement, the standard impedance for each individual trace 48-A, 48-B is substantially 50 Ohms (e.g., +/−10%), and the differential impedance for the traces 48-A, 48-B as a differential pair is substantially 100 Ohms (e.g., +/−10%). Furthermore, the standard impedance for each individual trace 50-A, 50-B is substantially 90 Ohms, and the differential impedance for the traces 50-A, 50-B as a differential pair is substantially 150 Ohms. The impedance differences of the traces 48, 50 is due, at least in part, to the fact that the impedance of traces 48 is affected by the distance of the traces 48 from the conductive plane 52 over which the traces 48 lie, while the impedance of the traces 50 is affected by the distance of the traces 50 from the conductive region 56 over which the traces 50 lie. Accordingly, the circuit board 26 is well-suited for accommodating circuitry that includes (i) some circuits requiring 50 Ohm standard impedance (and perhaps 100 Ohm differential impedance) and (ii) other circuits requiring 90 Ohm standard impedance and/or 150 Ohm differential impedance, for minimizing reflection and for optimal signal integrity. For instance, the circuit board 26 is well suited for connecting processor circuitry which desires individual 50 Ohm traces and 100 Ohm differential pair traces, and Fibre Channel circuitry which desires 150 Ohm differential pair traces.

By way of example only for the above-described arrangement, the signal layer 30 is substantially 0.6 mils thick (or substantially 2.0 mils thick after plating), the separating layer 36 is substantially 3.7 mils thick, the signal layer 32 is substantially 1.2 mils thick, the separating layer 38 is substantially 6.1 mils thick, and the signal layer 34 is substantially 1.2 mils thick (e.g., with a predetermined degree of error such as +/−10% for each layer). In this arrangement, the trace width of the traces 48-A, 48-B is substantially 6.0 mils, and the distance 82 between the traces 48-A, 48-B is substantially 15.0 mils. Additionally, the trace width of the traces 50-A, 50-B is substantially 5.0 mils, and the distance 84 between the traces 50-A, 50-B is substantially 14.0 mils. In this arrangement, the increase in differential impedance for the traces 50-A, 50-B (over the differential impedance for the traces 48-A, 48-B) is accompanied by a slight narrowing of the distance between the traces 50-A, 50-B (e.g., 14.0 mils vis-à-vis 15.0 mils for the traces 48-A, 48-B). Accordingly, when designing circuit board 26, the manufacturer (i.e., the circuit board designer and/or producer) did not need to move the traces 50-A, 50-B farther apart to increase the differential impedance from 100 Ohms to 150 Ohms. Rather, the manufacturer was able to actually move the traces 50-A, 50-B slightly closer together due to the increase in distance of the traces 50-A, 50-B from the closest conductive planar structure, i.e., the traces 50-A, 50-B are spaced substantially 11.0 mils from the conductive region 56 rather than only 3.7 mils from the conductive plane 52. Accordingly, the traces 50-A, 50-B do not need to be moved farther apart which would otherwise result in less exposure to the same interference, a common drawback to conventional approaches of increasing differential impedance by increasing the distance between traces.

In other arrangements, the differential impedance of the traces 50-A, 50-B is increased from 100 Ohms to 150 Ohms without reducing the trace width of the traces 50-A, 50-B (e.g., from 6.0 mils to 5.0 mils). For example, in one arrangement, the distance between the traces 50-A, 50-B and the conductive region 56 is further increased. Other arrangements having other dimensions which are suitable for use by the circuit board 26 as well in order to avoid reducing the trace width of the traces 50-A, 50-B. Accordingly, the manufacturer can provide traces with different impedances without being hindered by any trace width limitation unlike the conventional approach to increasing trace impedance by narrowing the trace width of some traces which could violate a minimum trace width specification for the circuit board.

It should be further understood that the manufacturer does not need to increase the distance between differential pair traces to increase differential impedance between the traces 50. Rather, the manufacturer can simply provide a carved-out section of the conductive plane 52 (i.e., the non-conductive region 54) and a conductive region 56 at a further distance from the traces 50. Accordingly, the manufacturer can increase trace impedance without separating the traces 50 unlike the conventional approach to increasing trace impedance by separating traces which could result in exposing the traces to different noise and interference patterns. Further details of the invention will now be described with reference to FIG. 2.

Figure 2:
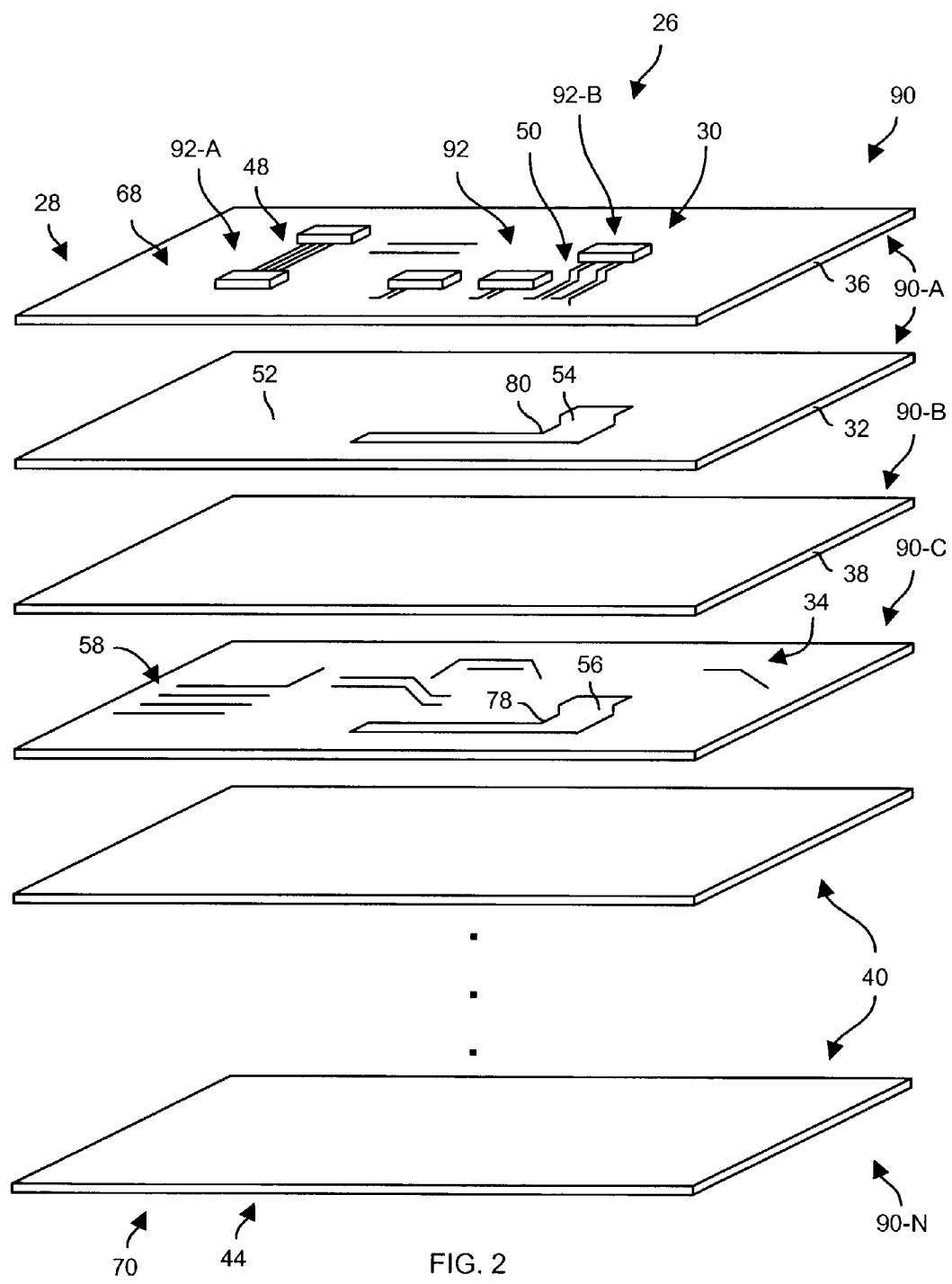
FIG. 2 is a perspective view of particular layers of the circuit board of FIG. 1.

FIG. 2 shows a perspective view of particular layers 28 of the circuit board 26. As shown, the circuit board 26 includes multiple circuit board sheets 90 which are laminated together to form a single board. In particular, the circuit board 26 includes a first circuit board sheet 90-A having the separating layer 36 with the signal layers 30 and 32 formed thereon. Although the signal layer 30 is shown in contact with the separating layer 36, the signal layer 32 is shown detached from the separating layer 36 in order to provide a better view of the signal layer 32. The circuit board 26 includes other circuit board sheets 90 which include the other layers 28 such as (i) a circuit board sheet 90-B having the separating layer 38 (e.g., a non-conductive core layer), (ii) another circuit board sheet 90-C having the signal layer 34, and eventually another circuit board sheet 90-N having the signal layer 44 which defines the bottom surface 70 of the circuit board 26 (also see FIG. 1).

As shown in FIG. 2, the circuit board 26 further includes a set of circuit board components 92 (e.g., ICs, resistors, capacitors, etc.) which mount on the surface 68 of the circuit board 26 and which electrically connect with at least some of the signal layers. By way of example only, the circuit board components 92 include a processor chipset 92-A, and a set of Fibre Channel devices 92-B which are configured to perform Fibre Channel operations, e.g., transmit and/or receive Fibre Channel signals based on the Fibre Channel protocol. The circuitry of the processor chipset 92-A requires individual traces with 50 Ohm standard impedance, and differential pair traces of 100 Ohms, to minimize signal reflection and to provide robust signal integrity. Additionally, the circuitry of the Fibre Channel devices 92-B requires differential pair traces of 150 Ohms to minimize signal reflection and for robust signal integrity. Accordingly, the differential pair traces 48, 50 (also see FIG. 1) are well-suited to providing the proper impedances to the circuitry of the circuit board components 92.

As further shown in FIG. 2, the signal layer 32 of the circuit board sheet 90-A includes the conductive plane 52 (also see the conductive material 64 of FIG. 1) and the non-conductive region 54 (also see the non-conductive material 62 of FIG. 1). The signal layer 34 of the circuit board sheet 90-B includes the conductive region 56 and other signal traces 58. As mentioned earlier and as clearly illustrated in FIG. 2, the conductive region 56 of the signal layer 34 substantially mirrors the non-conductive region 54 of the signal layer 32. That is, the conductive region 56 covers the carved-out area of the conductive plane 52, i.e., the non-conductive region 54 of the signal layer 32. In particular, the edges 78 of the conductive region 56 slightly overlap the edges 80 of the conductive plane 52 so that plated through-holes 66 can simultaneously contact the conductive plane 52 and the conductive region 56 to form a robust electrical connection between the two (also see FIG. 1). Accordingly, the conductive region 54 operates as part of a power supply plane that carries a power supply signal, but that enables different overlying signal traces to have different impedances. In particular, the traces 48 have 50 Ohm impedance and 100 differential impedance, while the traces 50 have 90 Ohm impedance and 150 differential impedance. By way of example, both the non-conductive region 54 of the signal layer 32 and the conductive region 56 of the signal layer 34 are L-shaped. Further details of the invention will now be provided with reference to FIGS. 3 through 6.

Figure 3:
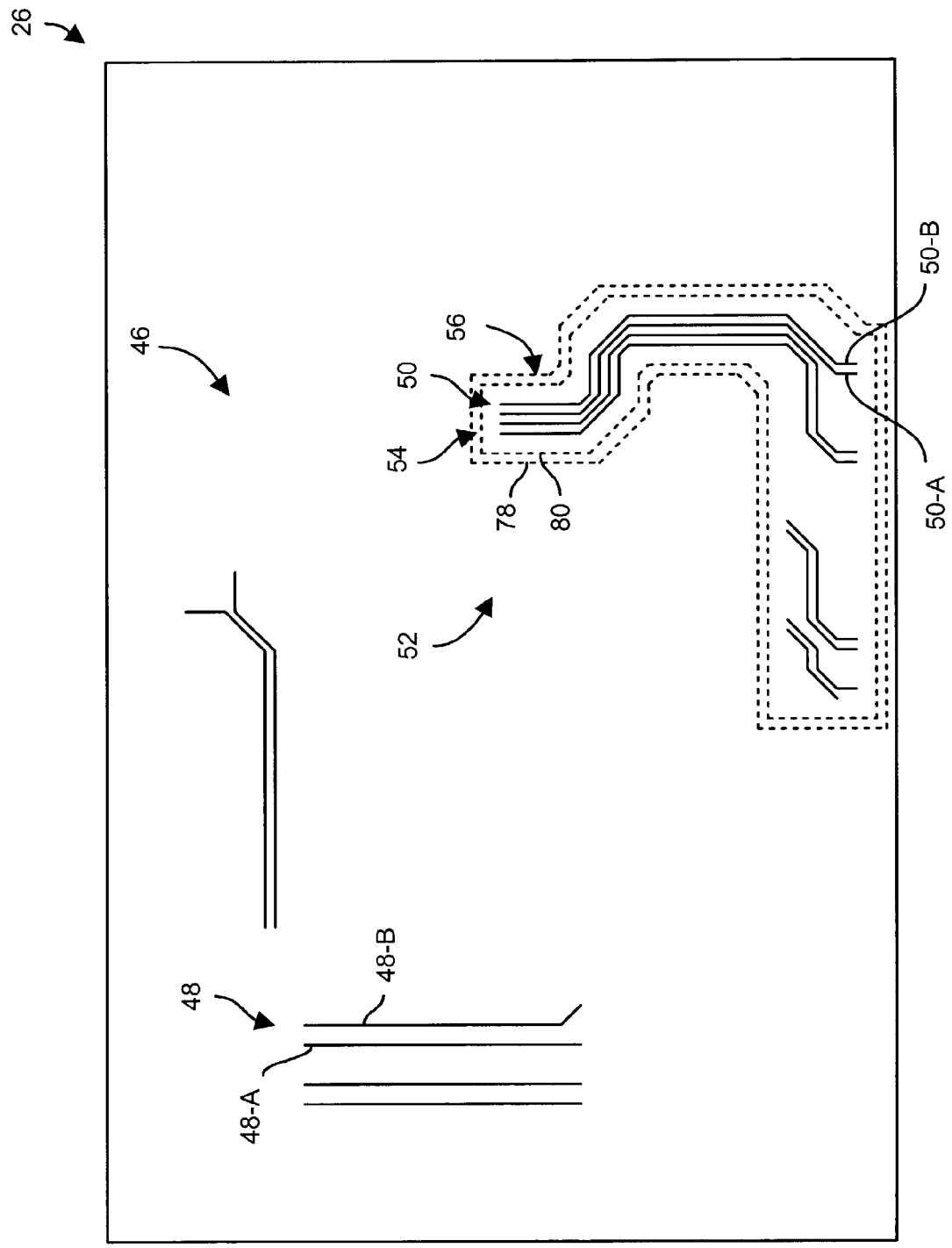
FIG. 3 is a composite view showing features of particular layers of the circuit board of FIG. 1.

FIG. 3 is a composite top view showing features of particular layers of the circuit board 26 of FIG. 1. In particular, the conductors 46 on the top surface 68 of the circuit board 26 are shown in solid lines (also see FIG. 1). The edges 78 of the conductive region 56 of the buried signal layer 34 are shown in dashed lines. Similarly, the inner edges 80 of the conductive plane 52 of the buried signal layer 32 are shown in dashed lines.

Figure 4:
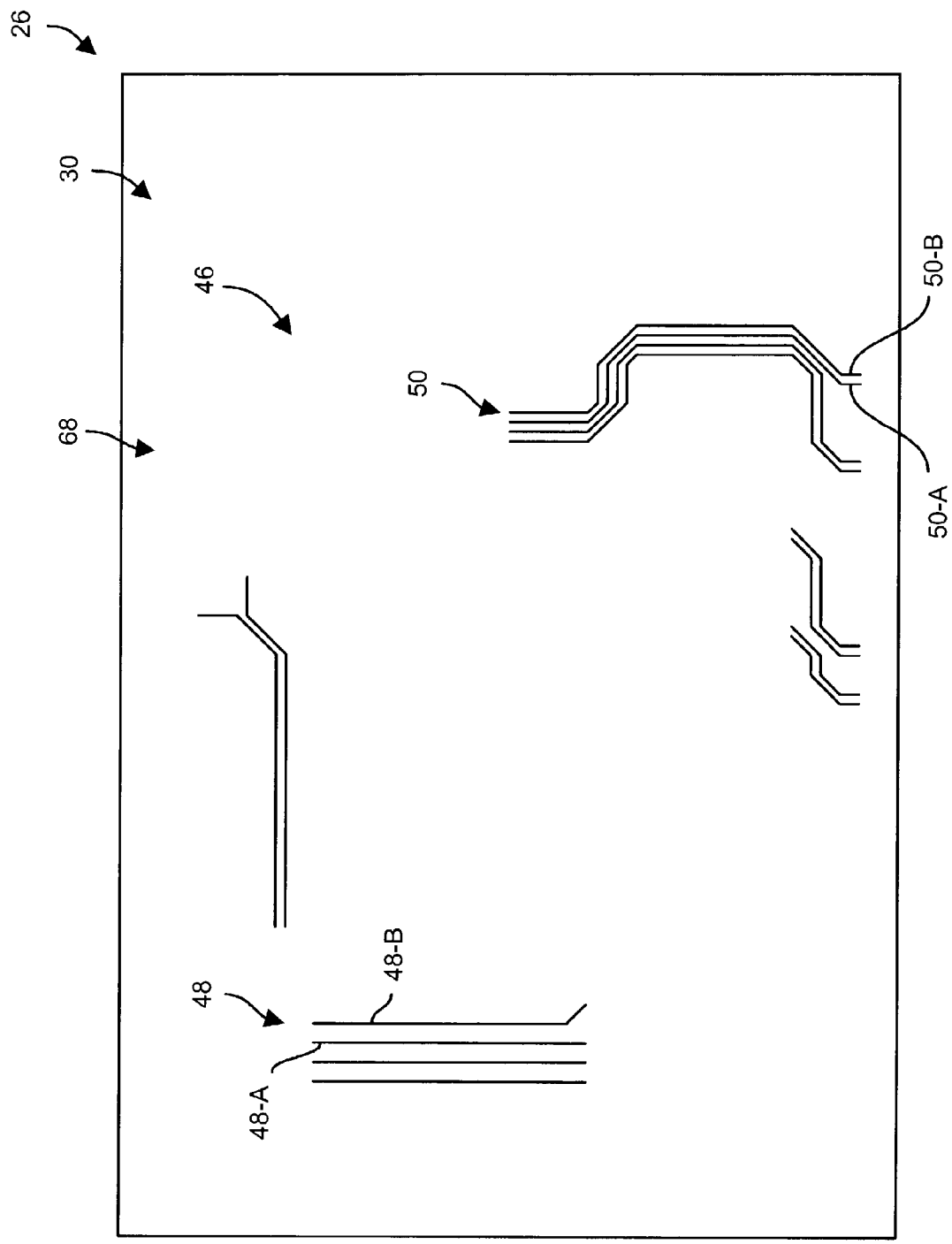
FIG. 4 is a view of a top signal layer of the circuit board of FIG. 1.
Figure 5:
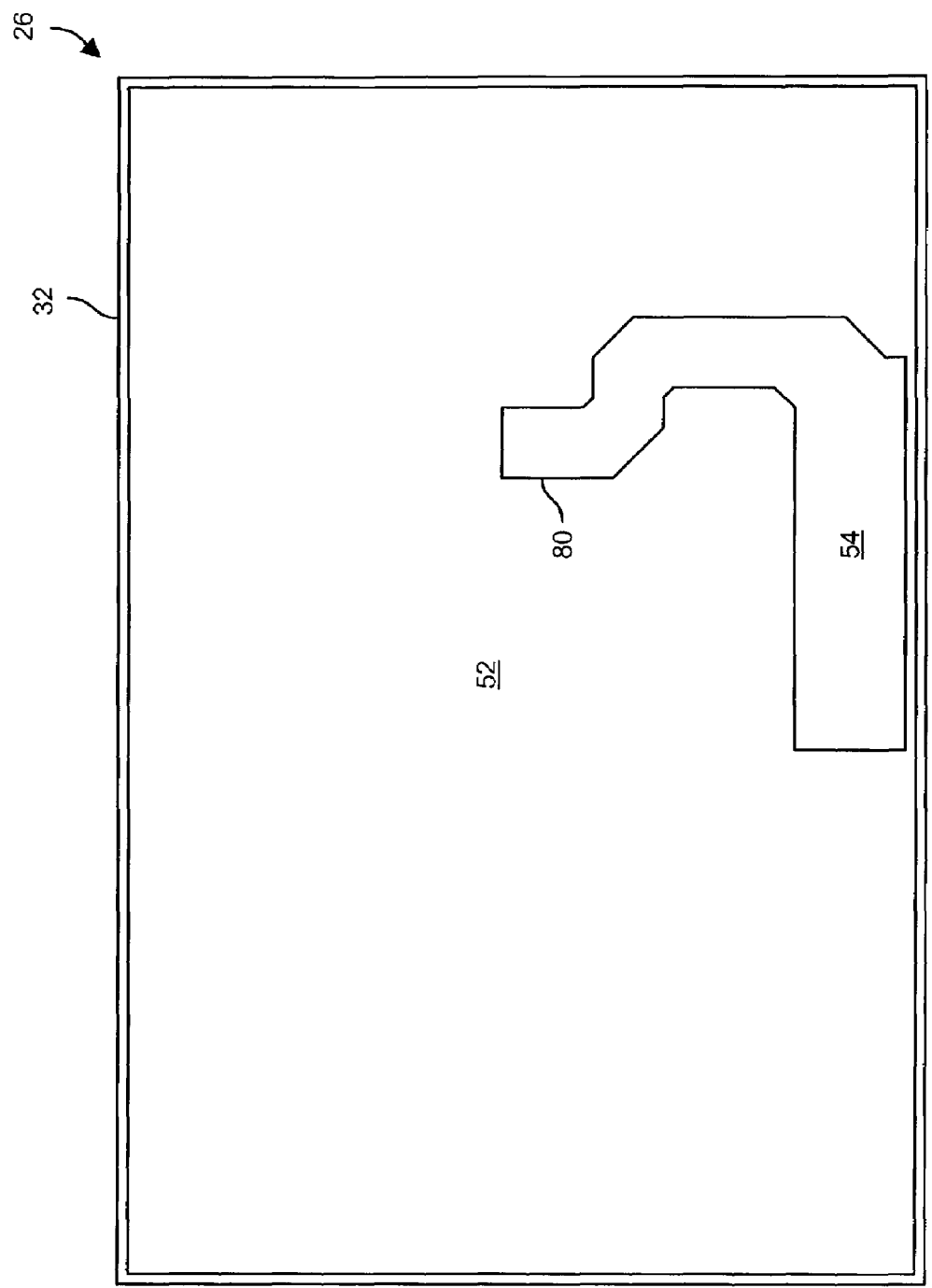
FIG. 5 is a view of an intermediate signal layer of the circuit board of FIG. 1.
Figure 6:
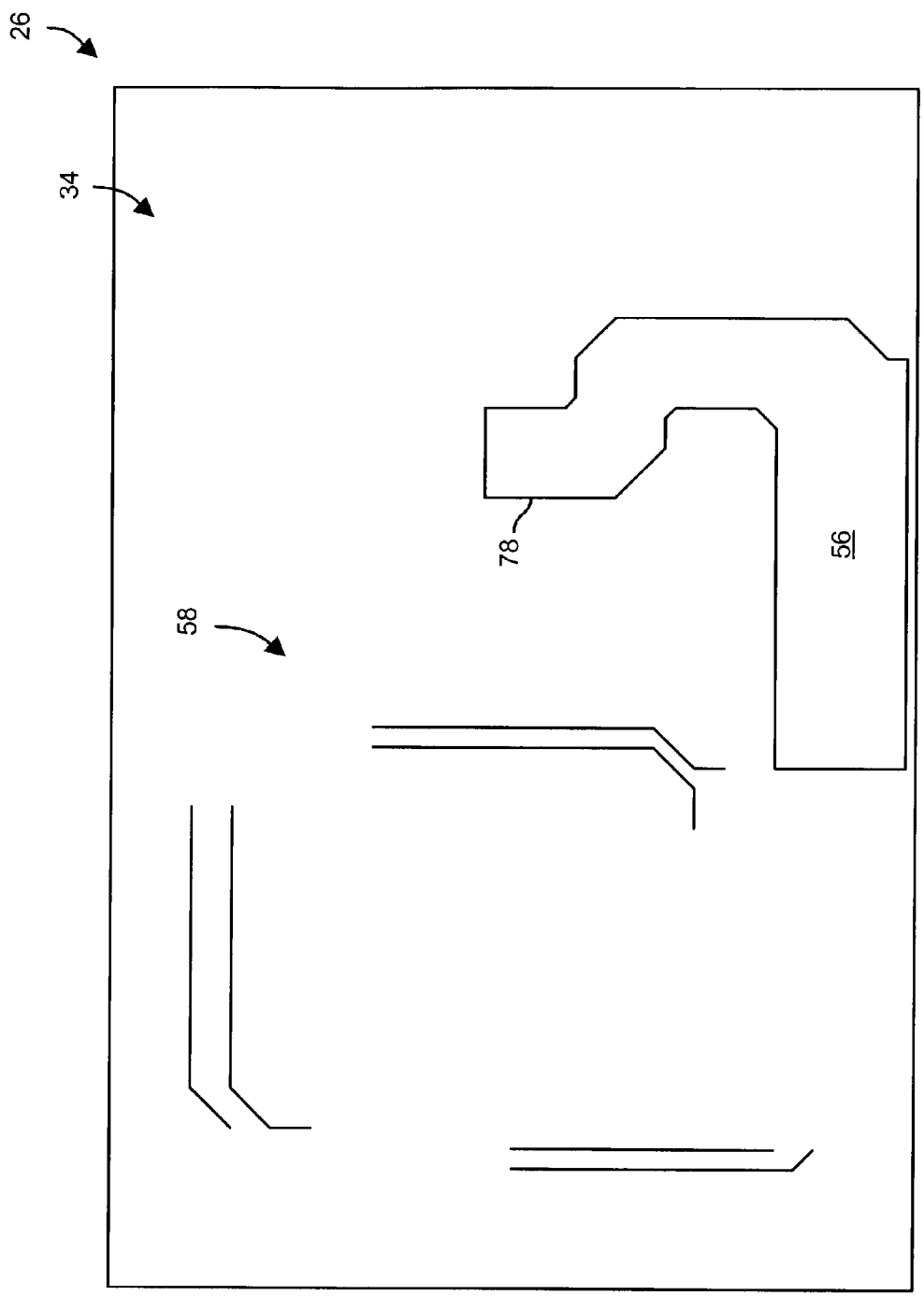
FIG. 6 is a view of another intermediate signal layer of the circuit board of FIG. 1.

As shown in FIG. 3, the conductive region 56 mirrors the conductive plane 52 by covering the carved-out, non-conductive region 54 of the signal layer 32, and slightly overlapping the inner edges 80 of the conductive plane 52 to enable plated through-holes 60 along the edges 78, 80 (see FIGS. 1 and 2) to electrically connect the conductive plane 52 with the conductive region 56. In particular, the shape of the conductive region 56 reflects or mimics the shape of the non-conductive region 54 within the conductive plane 52. Accordingly, the traces 48 which overly the conductive plane 52 of the signal layer 32 have a first impedance due, at least in part, to their distance from the conductive plane 52. In contrast, the traces 50 which overly the conductive region 56 of the signal layer 34 have a second impedance due, at least in part, to their distance from the conductive region 56 of the signal layer 34. FIGS. 4 through 6 show respective features of the particular signal layers 30, 32, 34.

FIG. 4 shows a top view of the circuit board surface 68 with the traces 46 of the signal layer 30. As mentioned earlier in connection with FIG. 1, the traces 46 include both the differential pair traces 48 as well as the differential pair traces 50.

Although the conductive plane 52 of the signal layer 32 and the conductive region 56 of the signal layer 34 are hidden from view in the top view of the circuit board surface 68 of FIG. 4, recall that the differential pair traces 48 overly the conductive plane 52, and that the differential pair traces 50 overly the conductive region 56 (also see FIG. 3). Accordingly, each of the differential pair traces 48 has a first standard impedance (e.g., 50 Ohms), and each of the differential pair traces 50 has a different standard impedance (e.g., 90 Ohms). Additionally, the differential pair traces 48 have a first differential impedance (e.g., 100 Ohms), and the differential pair traces 50 have a second differential impedance (e.g., 150 Ohms).

FIG. 5 is a top view of the signal layer 32. As shown, the signal layer 32 includes the conductive plane 52 of conductive material 62, and the non-conductive region 54 of non-conductive material 64. The non-conductive region 54 is essentially a carved-out area within the conductive plane 52 which is filled with non-conductive material 62. By way of example only, the non-conductive region is L-shaped to accommodate the layout of particular traces for the Fibre Channel circuitry 92-A (also see FIG. 3).

FIG. 6 is a top view of the signal layer 34. As shown, the signal layer 34 includes the conductive region 56 of conductive material 62, as well as other conductors 58. By way of example only, the conductors 58 are configured to carry data signals, i.e., signals containing information used to control the operation of the circuitry 92 of the circuit board 26. The conductive region 56 of the signal layer 34 mirrors the non-conductive region 54 of the signal layer 32 (FIG. 5). That is, when the layers 32, 34 are installed within the circuit board 26, the conductive region 56 covers the non-conductive region 54 and slightly overlaps the edges 80 of the conductive plane 52 so that plate through-holes 66 (FIG. 1) can electrically connect the conductive region 56 with the conductive plane 52. Accordingly, the conductive region 56 and the conductive plane 52 operate together as a power supply plane, while the conductive plane 52 enables the overlying traces 48 to have a first impedance, and the conductive region 56 enables the overlying traces 50 to have a second impedance. By way of example only, the conductive region is L-shaped thus roughly mimicking the non-conductive region 54. Further details of the invention will now be provided with reference to FIG. 7.

Figure 7:
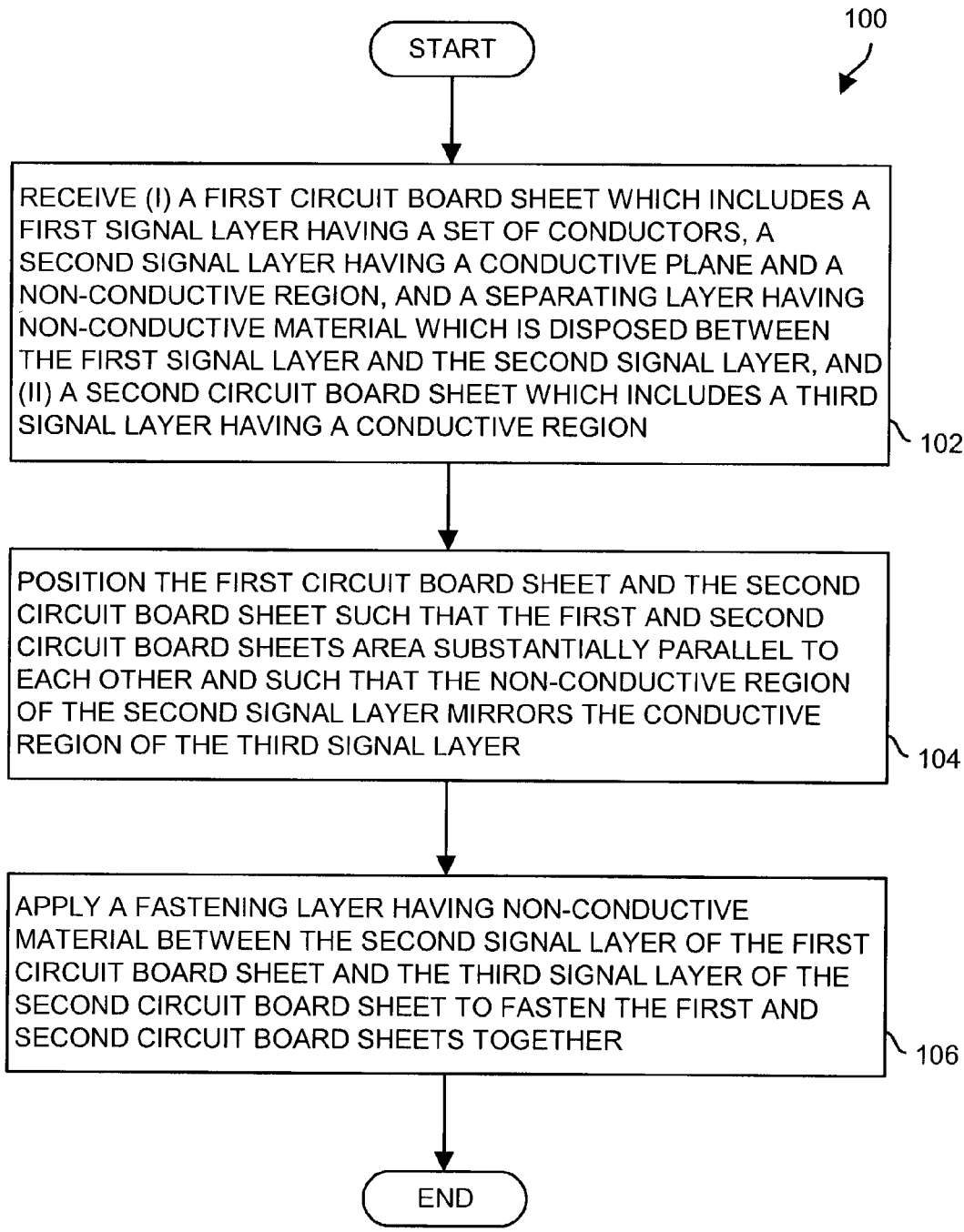
FIG. 7 is a flowchart of a procedure which is performed by a manufacturer of the circuit board of FIG. 1.

FIG. 7 shows, by way of example only, a procedure 100 which is performed by a manufacturer of the circuit board 26 of the electronic system 20 when making the circuit board 26. In step 102, the manufacturer receives the circuit board sheet 90-A which includes the signal layer 30 having the set of conductors 46, the signal layer 32 having the conductive plane 52 and the non-conductive region 54, and the separating layer 36 having non-conductive material 62 which is disposed between the signal layer 32 and the signal layer 34. The manufacturer also receives the circuit board sheet 90-C which includes the signal layer 34 having a conductive region 56 (also see FIGS. 1 and 2). At this time, the manufacturer can receive additional circuit board sheets 90 as well (e.g., the circuit board sheet 90-N of FIG. 2, etc.).

In step 104, the manufacturer positions the circuit board sheets 90-A, 90-C. In particular, the manufacturer aligns the circuit board sheet 90-A and the circuit board sheet 90-C together such that the circuit board sheets 90 are substantially parallel to each other, and such that the non-conductive region 54 of the signal layer 32 of the sheet 90-A mirrors the conductive region 56 of the signal layer 34 of the sheet 90-C.

In step 106, the manufacturer applies the separating layer 36 having non-conductive material 62 (i.e., the circuit board sheet 90-B) between the signal layer 32 of the circuit board sheet 90-A and the signal layer 34 of the circuit board sheet 90-C. The separating layer 36 can include adhesive or other fastening material which fastens the circuit board sheets 90-A, 90-C together during the lamination process (e.g., a process of applying glue, pressure and heat).

It should be understood that the manufacturer can perform steps 104 and 106 simultaneously and perhaps with additional circuit board sheet 90 at the same time. For instance, the manufacturer can simultaneously position the sheets 90-A through 90-N of FIG. 2 thus concurrently performing steps 104 and 106. As a result, the manufacturer creates the circuit board 26 which is well-suited for accommodating circuitry that requires conductors of different impedances (e.g., standard impedances of 50 Ohms and 90 Ohms, differential impedances of 100 Ohms and 150 Ohms, etc.).

As described above, the invention is directed to techniques for making a circuit board 26 which involve, relative to a set of signal layer traces 48, 50 of a signal layer 30, placing a non-conductive region 54 within a conductive plane 52 of another signal layer 32, and a mirroring conductive region 56 in yet another signal layer 36. As a result, any signal layer trace 50 overlying the non-conductive region 54 within the conductive plane 52 can derive its impedance based on its distance from the mirroring conductive region 56 rather than its distance from the conductive plane 52. Thus, some signal layer traces 48 can have a first impedance (e.g., 50 Ohms) based on distance from the conductive plane 52 while other signal layer traces 50 can have a second impedance (e.g., 90 Ohms), which is different than the first impedance, based on distance from the conductive region 56.

While this invention has been particularly shown and described with references to preferred embodiments thereof, it will be understood by those skilled in the art that various changes in form and details may be made therein without departing from the spirit and scope of the invention as defined by the appended claims.

For example, it should be understood that the signal layer 30 was described above as having 100 Ohm differential pair traces 48 and 150 Ohm differential pair traces 50 to accommodate circuitry 92-A, 92-B requiring different impedances, by way of example only. The traces 48, 50 do not need to be differential pair traces. Rather, the circuit board 26 is well-suited for providing traces with different individual line impedances as well. For example, as shown in FIG. 1, each trace 48 is a 50 Ohm trace, and each trace 50 is a 90 Ohm trace.

Additionally, it should be understood that the signal layer 30 having traces 48, 50 of different impedances does not need to be a surface layer of the circuit board 26. In other arrangements, the signal layer 30 is buried within the circuit board 26 by other layers 28 on both sides, but derives impedance from the conductive plane 52 of the signal layer 32 and the conductive region 56 of the signal layer 34 because those layers 32, 34 are the closest planar structures to the signal layer 30.

Furthermore, it should be understood that the configuration of the signal layers 32, 34 could be reversed. For example, suppose that the traces 48 (i.e., most of the traces within the signal layer 30) are to be 90 Ohm traces, and that the traces 50 (i.e., only a few of the traces within the signal layer 30) are to be 50 Ohm traces. Here, the signal layer 34 containing the conductive region 56 could be moved to a higher layer so that it is closer to the signal layer 30 in order to provide the traces 50 with 50 Ohm impedance, and the signal layer 32 containing the conductive plane 52 could be moved lower so that it is further away from the signal layer 30 in order to provide the traces 48 with 90 Ohm impedance.

Additionally, it should be understood that the circuit board 26 was described above as including traces of two different impedances by way of example only. In other arrangements, the circuit board 26 can provide more than two different impedances (e.g., three different impedances, four different impedances, etc.). Moreover, such different impedances can be provided to traces within the same signal layer using the configuration described above (i.e., a carved-out conductive plane in combination with a conductive region in another layer) or in combination with conventional approaches to changing impedances (e.g., changing trace widths, etc.). In one arrangement, the circuit board 26 includes multiple carved-out sections within a conductive plane, and multiple conductive regions in one or more other signal layers.

Furthermore, it should be understood that the conductive region 56 of the signal layer 34 was described above as at least approximating the shape of the carved-out non-conductive region 54 of the conductive plane 52 by way of example only. In other arrangements, the conductive region 56 does not approximate the shape of the carved-out non-conductive region 54 but has a different shape (e.g., the conductive region 54 is a contiguous conductive plane through the entire signal layer, etc.).

Additionally, it should be understood that the above-described techniques of the invention were described as affecting the impedance of various traces or etch of the circuit board 26, i.e., characteristic impedance ($Z_0$), differential impedance, etc. The techniques can be used to affect other aspects of the circuit board as well (e.g., capacitance, etc.).

Furthermore, it should be understood that the procedure 100 for making the circuit board 26 was provided by way of example only. There are other procedures for making the circuit board 26 which are suitable for use by the invention. For example, in some arrangements, the manufacturer incorporates the signal layers 32, 34 and the separating layer 38 into a single circuit board sheet 90, and combines that circuit board sheet 90 with other circuit board sheets 90 to generate a rigid board structure. The manufacturer then applies foil to the surfaces of the rigid board structure and performs another etching process to form the outer signal layers 30, 44 (FIG. 1). As a result, the outer signal layer 30 includes a first set of conductors 48 having a first impedance (e.g., 50 Ohms) based on a distance between the set of conductors 48 and the conductive plane 52 of the signal layer 32, and a second set of conductors 50 having a second impedance (e.g., 90 Ohms) based on a distance between the set of conductors 50 and the conductive region 56 of the signal layer 34. In some situations, these arrangements can provide certain advantages over the procedure 100 such as improving yields, improving manufacturability, etc.

What is claimed is:

1. A circuit board, comprising:
   a first signal layer having a set of conductors;
   a second signal layer having a conductive plane and a non-conductive region;
   a third signal layer having a conductive region that mirrors the non-conductive region of the second signal layer;
   a first separating layer having non-conductive material which is disposed between the first signal layer and the second signal layer; and
   a second separating layer having non-conductive material which is disposed between the second signal layer and the third signal layer;
   the set of conductors of the first signal layer including input/output traces; and
   at least some of the input/output traces and the non-conductive region of the second signal layer extending, in an overlapping manner, from a central location of the circuit board to a peripheral location along an edge of the circuit board.

2. The circuit board of claim 1 wherein the first signal layer is an outer layer of the circuit board, and wherein the input/output traces which extend in the overlapping manner include outer-layer traces which are configured to carry data signals.

3. The circuit board of claim 1 wherein the third signal layer further includes inner-layer traces which are configured to carry data signals; and wherein the conductive region of the third signal layer is configured to carry a power supply signal.

4. The circuit board of claim 3 wherein the conductive region is a contiguous planar-shaped section having a planar width which is substantially wider than each of the inner-layer traces of the third signal layer.

5. The circuit board of claim 1, further comprising:
   a set of plated-through holes which electrically interconnects the conductive plane of the second signal layer with the conductive region of the third signal layer.

6. The circuit board of claim 5 wherein the set of plated-through holes is disposed substantially around a periphery of the conductive region of the third signal layer.

7. The circuit board of claim 1, further comprising:
   a fourth signal layer having a conductive plane; and
   an integrated circuit device electrically coupled to the conductive plane of the second signal layer and electrically coupled to the conductive plane of the fourth signal layer, wherein the integrated circuit device is configured to receive a ground signal through the conductive plane of the second signal layer and a power supply signal through the conductive plane of the fourth signal layer.

8. The circuit board of claim 7 wherein the integrated circuit device is configured to perform Fibre Channel protocol operations.

9. The circuit board of claim 1, further comprising:
a fourth signal layer having a conductive plane; and
an integrated circuit device electrically coupled to the conductive plane of the second signal layer and electrically coupled to the conductive plane of the fourth signal layer, wherein the integrated circuit device is configured to receive a power supply signal through the conductive plane of the second signal layer and a ground signal through the conductive plane of the fourth signal layer.

10. The circuit board of claim 9 wherein the integrated circuit device is configured to perform Fibre Channel protocol operations.

11. The circuit board of claim 1 wherein the input/output traces which extend in the overlapping manner include two traces which are configured to carry Fibre Channel protocol differential signals.

12. The circuit board of claim 1 wherein the set of conductors of the first signal layer includes:
first traces overlying the conductive plane of the second signal layer, the first traces having a first impedance; and
second traces overlying (i) the non-conductive region of the second signal layer and (ii) the conductive region of the third signal layer, the second traces having a second impedance which is different than the first impedance.

13. An electronic system, comprising:
a power supply having a voltage terminal and a ground terminal;
an interconnect in electrical communication with the voltage terminal and the ground terminal of the power supply; and
a circuit board having:
a first signal layer having a set of conductors,
a second signal layer having a conductive plane and a non-conductive region,
a third signal layer having a conductive region that mirrors the non-conductive region of the second signal layer,
a fourth signal layer having a conductive plane,
a first separating layer having non-conductive material which is disposed between the first signal layer and the second signal layer,
a second separating layer having non-conductive material which is disposed between the second signal layer and the third signal layer, and
a third separating layer which is disposed between the third signal layer and the fourth signal layer;
wherein the conductive plane of the second signal layer is in electrical communication with one of the voltage terminal and the ground terminal of the power supply through the interconnect,
wherein the conductive plane of the fourth signal layer is in electrical communication with the other of the voltage terminal and the ground terminal of the power supply through the interconnect;
wherein the set of conductors of the first signal layer includes input/output traces; and
wherein at least some of the input/output traces and the non-conductive region of the second signal layer extend, in an overlapping manner, from a central location of the circuit board to a peripheral location along an edge of the circuit board.

14. The electronic system of claim 13 wherein the circuit board further includes:
an integrated circuit device which is electrically coupled to the set of conductors of the first signal layer, the conductive plane of the second signal layer and the conductive plane of the fourth signal layer; and wherein the integrated circuit device is configured to perform Fibre Channel protocol operations.

15. The electronic system of claim 13 wherein the set of conductors of the first signal layer of the circuit board includes (i) a first set of traces which is configured to carry differential signals and (ii) a second set of traces, wherein a geometrical relationship between the first set of traces and the conductive region of the third signal layer provides a differential impedance of substantially 150 Ohms, and wherein a geometrical relationship between each of the second set of traces and the conductive plane of the second signal layer provides an impedance of substantially 50 Ohms.

16. The electronic system of claim 13 wherein the set of conductors of the first signal layer of the circuit board includes (i) a first set of traces and (ii) a second set of traces, wherein a geometrical relationship between each of the first set of traces and the conductive region of the third signal layer provides an impedance of substantially 90 Ohms, and wherein a geometrical relationship between each of the second set of traces and the conductive plane of the second signal layer provides an impedance of substantially 50 Ohms.

17. The electronic system of claim 13 wherein the set of conductors of the first signal layer of the circuit board includes (i) a first set of differential signal traces which overlaps the non-conductive region of the second signal layer, and (ii) a second set of differential signal traces which overlaps the conductive plane of the second signal layer; wherein traces of the first set of differential signal traces are separated by a distance of substantially 14.0 mils; and wherein traces of the second set of differential signal traces are separated by a distance of substantially 15.0 mils.

18. The electronic system of claim 13 wherein the set of conductors of the first signal layer of the circuit board includes:
first traces overlying the conductive plane of the second signal layer, the first traces having a first impedance; and
second traces overlying (i) the non-conductive region of the second signal layer and (ii) the conductive region of the third signal layer, the second traces having a second impedance which is different than the first impedance.

19. A circuit board, comprising:
a first signal layer having a set of conductors;
a second signal layer having a conductive plane and a non-conductive region;
a third signal layer having a conductive region that mirrors the non-conductive region of the second signal layer;
a first separating layer having non-conductive material which is disposed between the first signal layer and the second signal layer; and
a second separating layer having non-conductive material which is disposed between the second signal layer and the third signal layer;
wherein the first separating layer, the second signal layer and the second separating layer combine to separate the first signal layer and the third signal layer by a distance which is substantially 11.0 mils; and wherein the first separating layer separates the first signal layer and the second signal layer by substantially 3.7 mils.

20. An electronic system, comprising:

a power supply having a voltage terminal and a ground terminal;

an interconnect in electrical communication with the voltage terminal and the ground terminal of the power supply; and a circuit board having:
  a first signal layer having a set of conductors,
  a second signal layer having a conductive plane and a non-conductive region,
  a third signal layer having a conductive region that mirrors the non-conductive region of the second signal layer,
  a fourth signal layer having a conductive plane,
  a first separating layer having non-conductive material which is disposed between the first signal layer and the second signal layer,
  a second separating layer having non-conductive material which is disposed between the second signal layer and the third signal layer, and
  a third separating layer which is disposed between the third signal layer and the fourth signal layer;

wherein the conductive plane of the second signal layer is in electrical communication with one of the voltage terminal and the ground terminal of the power supply through the interconnect, wherein the conductive plane of the fourth signal layer is in electrical communication with the other of the voltage terminal and the ground terminal of the power supply through the interconnect;

wherein the first separating layer, the second signal layer and the second separating layer combine to separate the first signal layer and the third signal layer by a distance which is substantially 11.0 mils; and wherein the first separating layer separates the first signal layer and the second signal layer by substantially 3.7 mils.

21. A circuit board, comprising:

a first signal layer having a set of conductors;

a second signal layer having a conductive plane and a non-conductive region;

a third signal layer having a conductive region that mirrors the non-conductive region of the second signal layer;

a first separating layer having non-conductive material which is disposed between the first signal layer and the second signal layer; and a second separating layer having non-conductive material which is disposed between the second signal layer and the third signal layer;

wherein the set of conductors of the first signal layer includes (i) a first set of differential signal traces which overlaps the non-conductive region of the second signal layer, and (ii) a second set of differential signal traces which overlaps the conductive plane of the second signal layer;

wherein traces of the first set of differential signal traces are separated by a distance of substantially 14.0 mils; and wherein traces of the second set of differential signal traces are separated by a distance of substantially 15.0 mils.

22. A circuit board, comprising:

a first signal layer having a set of conductors;

a second signal layer having a conductive plane and a non-conductive region;

a third signal layer having a conductive region that mirrors the non-conductive region of the second signal layer;

a first separating layer having non-conductive material which is disposed between the first signal layer and the second signal layer; and a second separating layer having non-conductive material which is disposed between the second signal layer and the third signal layer;

wherein the set of conductors of the first signal layer includes (i) a first set of traces which is configured to carry differential signals and (ii) a second set of traces, wherein a geometrical relationship between the first set of traces and the conductive region of the third signal layer provides a differential impedance of substantially 150 Ohms, and wherein a geometrical relationship between each of the second set of traces and the conductive plane of the second signal layer provides an impedance of substantially 50 Ohms.

23. A circuit board, comprising:

a first signal layer having a set of conductors;

a second signal layer having a conductive plane and a non-conductive region;

a third signal layer having a conductive region that mirrors the non-conductive region of the second signal layer;

a first separating layer having non-conductive material which is disposed between the first signal layer and the second signal layer; and a second separating layer having non-conductive material which is disposed between the second signal layer and the third signal layer;

wherein the set of conductors of the first signal layer includes (i) a first set of traces and (ii) a second set of traces, wherein a geometrical relationship between each of the first set of traces and the conductive region of the third signal layer provides an impedance of substantially 90 Ohms, and wherein a geometrical relationship between each of the second set of traces and the conductive plane of the second signal layer provides an impedance of substantially 50 Ohms.

* * * * *